United States Patent [19]

Kajiyama et al.

[11] Patent Number: 4,829,536
[45] Date of Patent: May 9, 1989

[54] MULTI-MODE NARROW-BAND OSCILLATION EXCIMER LASER

[75] Inventors: Koichi Kajiyama; Kaoru Saito, both of Fujieda; Yasuhiro Nozue, Yokohama; Noritoshi Ito; Osamu Wakabayashi, both of Hiratsuka; Junichi Fujimoto, Kanagawa; Masahiko Kowaka; Yasao Itakura, both of Hiratsuka, all of Japan

[73] Assignee: Kabushiki Kaisha Komatsu Seisakusho, Tokyo, Japan

[21] Appl. No.: 144,000

[22] PCT Filed: Jun. 9, 1987

[86] PCT No.: PCT/JP87/00366
§ 371 Date: Nov. 30, 1987
§ 102(e) Date: Nov. 30, 1987

[87] PCT Pub. No.: WO88/00767
PCT Pub. Date: Jan. 28, 1988

[30] Foreign Application Priority Data

Jun. 9, 1986 [JP] Japan .................. 61-133439
Aug. 13, 1986 [JP] Japan .................. 61-189803

[51] Int. Cl.$^4$ .............................. H01S 3/22
[52] U.S. Cl. ......................... 372/57; 372/19; 372/95; 372/99
[58] Field of Search .............. 372/57, 92, 93, 95, 372/98, 99, 19

[56] References Cited

PUBLICATIONS

Goldhar et al., "An Injection-Locked Unstable Resonator Rare Gas Halide Discharge Laser of Narrow-Linewidth and High Spect. Qualtity"; IEEE J.Q.E. vol. QE-16, No. 2, 2 Feb. 1982.

Primary Examiner—Léon Scott, Jr.
Attorney, Agent, or Firm—Diller, Ramik & Wight

[57] ABSTRACT

Specification of an etalon included in a multimode, narrow-band oscillation excimer laster used as a light source for light exposure in photolithography are set to satisfy a relation $S\lambda W\lambda R\lambda (u,v)d\lambda \geq \alpha$, where $\alpha$ is an optical transfer function necessary for light exposure of resist according to a reticle pattern, $R\lambda(u,v)$ is an optical transfer function of monochromatic light for an illuminating system and a reduced-projection lens, $W\lambda$ is a weight which is applied to a waveform of a power spectrum in an oscillation laser beam at a wavelength $\lambda$. Further, an inclination angle $\lambda$ of the etalon in its normal direction with respect to an optical axis when the etalon is provided between the chamber and rear mirror is set to satisfy a relation $\theta > \tan^{-1} S/2A$, where S is a dimension of a beam at a beam output mirror and A is a distance between the etalon and beam output mirror, and an oscillation linewidth K is set to satisfy relations $K=1/\lambda_o [1/\{\cos (\theta+\theta')\} - 1/\cos \theta\}$ and also $K \leq x$, where $\lambda_o$ is a selected wavelength when the beam is directed onto the etalon at a normal angle, $\theta'$ is a beam divergence angle, and x is an allowable linewidth of a light exposure system using the excimer laser as a light source.

2 Claims, 9 Drawing Sheets

MULTI-MODE NARROW-BAND OSCILLATION EXCIMER LASER

TECHNICAL FIELD

The present invention relates to excimer lasers which oscillate in narrow band and in multi-mode in which a laser beam has spatially incoherent characteristics and, more particularly, to a multi-mode, narrow-band excimer laser which can be used as a light source for light exposure in photolithography with a high resolution.

BACKGROUND ART

In recent years, an excimer laser for generating light belonging to ultraviolet frequency range has been used as a light source of light exposure in photolithography.

The excimer laser will be explained by referring to, for example, a product manufactured by Lambda Physik Company. FIG. 16 shows a laser of an injection lock type which comprises a resonator having a total reflective mirror 11 and a beam output mirror 12, an oscillator part 10 having a dispersion prism 13, apertures 14 and 15, and a pair of electrodes 16, and amplifier part 20 optically coupled to the oscillator part 10 through mirrors 17 an 18 and having mirrors 21 and 22 and a pair of electrodes 23.

In this laser, the oscillator part 10 functions to divide wavelengths of light waves through the dispersing prism (or grating, etalon or the like) 13 and to converge into a beam through the apertures 14 and 15, whereby such a laser beam can be obtained that has a narrow spectrum linewidth and coherent beam characteristics. The laser beam thus obtained is synchronously injected into the amplifier part 20 which forms an unstable resonator, to forcedly oscillate in its cavity mode and increase its power.

Such an arrangement as shown in FIG. 17 is published from the American Telephone and Telegraph Company (AT&T) in Proceedings of SPIE(conference name), "MICRO DEVICE CONFERENCE" by Victor Pol et al., issued April, 1986. With this laser, an exciting zone 34 is provided within a laser resonator having a total reflective mirror 31 and a beam output mirror 32, and two etalons 33 are disposed between the exciting zone 34 and beam output mirror 32, thus enabling oscillation of the laser having a narrow spectrum linewidth and a limited number of transversal modes.

However, such an excimer laser of the injection lock type has been defective in that it can provide a large output laser beam having a narrow spectrum linewidth but also of a single-mode (coherent beam), which results in that when it is used as a light source for projection reduction, it generates a speckle pattern disabling acquisition of a high resolution.

Such an injection lock type of laser has also had a problem that the use of only the oscillator part 10 using the apertures 14 and 15 causes a remarkable reduction of laser output, which requires the provision of the amplifier part 20 for synchronous injection, so that, if it is impossible to put the laser in synchronism through highly frequent repetition, it spontaneously oscillates, thus making large the size of the laser device itself.

Further, the AT&T laser also generates a speckle pattern because the number of transversal modes becomes insufficient when it is employed in an ordinary illuminating optical system for light exposure. For this reason, the illuminating engineering system must be of a scan mirror type, which involves the complicated arrangement and control of the light exposure apparatus. In addition, this type of laser, which is small in its power, requires a light exposure time of 25 seconds, leading practically to a limited range of applications.

A primary object of the present invention is, therefore, to provide a multi-mode, narrow-band oscillation, excimer laser which eliminates the above defects in the prior art and which can produce a laser beam having a narrow frequency band, a high output and a spatially incoherent beam characteristic and suitable for reduction projection.

DISCLOSURE OF INVENTION

In the present invention, the etalon used in the excimer laser is set to satisfy an equation which follows.

$$\int_\lambda W_\lambda R_\lambda(u,v) d\lambda \geq \alpha$$

where, $\alpha$ is an optical transfer function (OTF) necessary for light exposure of resist in accordance with the reticle pattern, $R_\lambda(u,v)$ is an OTF of a monochromatic light for an illuminating system and a reduced-projection lens, $W_\lambda$ is a weight which is applied to a spectral profile of a wavelength $\lambda$ in power spectrum of the laser beam and expressed by $W_\lambda = T(\lambda)/\int_\lambda T(\lambda) d\lambda$, where T is the power spectrum of the oscillation laser beam, $$T(\lambda) = \int (\lambda, \beta) \cdot \prod_{k=1}^{n} E \cdot (K_k \cdot F_{tk} \, FSR_k, \lambda),$$

$f(\lambda,\beta)$ is the power spectrum of virtual free running caused by an increase of a threshold value due to the presence of the etalon between the chamber and rear mirror, $\beta$ is the rate of an increase in the threshold value, $E(K_k, F_{tk}, FSR_k, \lambda)$ is the transfer function of power spectrum of light based on a single k-th etalon, $F_{tk}$ is a total finesse of each etalon, $FSR_k$ is a free spectral range for each etalon, and $K_k$ is a finesse coefficient. As a result, the excimer laser can oscillate with a resolution necessary to expose the resist according to the reticle pattern.

In accordance with the present invention, in an event where an etalon having specifications set as mentioned above is arranged between the rear mirror and chamber for oscillation of multi-mode and narrow band, an inclination angle $\theta$ of the normal of the etalon with respect to the optical axis of the laser beam is set to meet the following relationship.

$$\theta > \tan^{-1} S/2A$$

where, S is the size of a beam emitted from the beam output mirror and A is a distance between the etalon and the beam output mirror. A linewidth K is expressed in terms of an divergence angle $\theta'$ and an incident angle $\theta$ at which the laser beam enters the etalon as follows;

$$K = 1/\lambda_o \{1/\cos(\theta + \theta') - 1/\cos\theta\}$$

where $\lambda_0$ is a selected wavelength when the beam enters the etalon at an angle perpendicular to the etalon.

Therefore, by actually measuring the divergence and size of the laser beam, an etalon angle range necessary for obtaining a desired linewidth can be determined. In this manner, the excimer laser can oscillate in a narrow band and stable multi-mode and produce a high output laser beam without any amplification part.

BEST MODE FOR CARRYING OUT THE INVENTION

The present invention will be detailed by referring to attached drawings.

Figure 1:
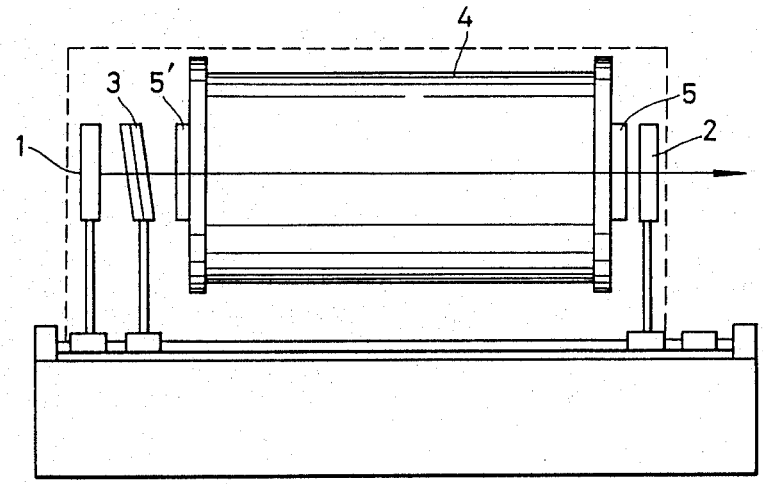
FIGS. 1, 2, and 5 to 8 schematically show excimer lasers comprising air gap etalons respectively.

Referring first to FIG. 1, there is shown an excimer laser in accordance with the present invention, which comprises a resonator having a total reflective mirror 1 and beam output mirror 2 and a single air gap etalon 3 disposed inside a cavity of the laser. Since the air gap etalon 3 as a wavelength selecting element is disposed in the cavity to select desired wavelengths of light through the etalon, this excimer laser can oscillate and produce a laser beam that has a narrow spectrum line width determined by the light transmission characteristic of the etalon 3 and that is suitable for light exposure of reduced projection, while avoiding reduction of the number of transversal modes. In FIG. 1, reference numerals 5 and 5' denote window parts of a chamber 4 respectively, which chamber is filled with, for example, a mixture gas of argon and fluorine, a mixture of krypton, or the other mixture and is sealed by these window parts 5 and 5', in which molecules formed by coupling atoms in excited or excimer state with atoms in normal or ground state are utilized to oscillate a laser beam having a short wavelength (193 nm for the Ar/F mixture gas, and 248 nm of the ultra violet wavelength for the Kr/F mixture gas) and a essentially incoherent property.

Figure 2:
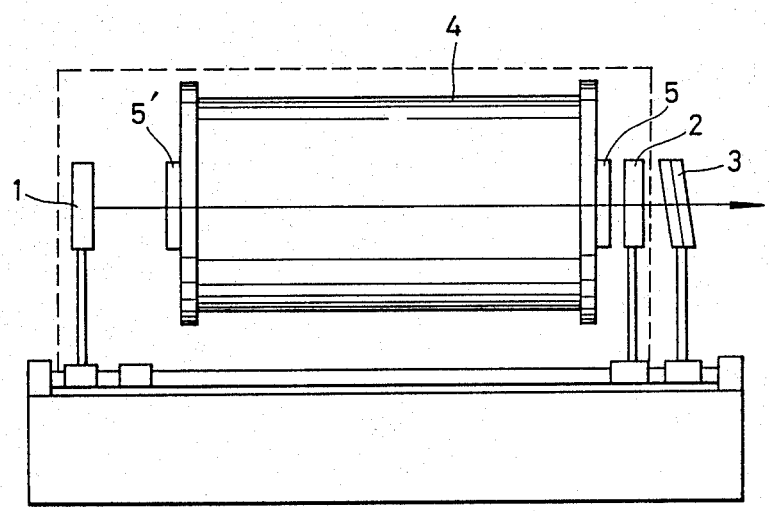

FIG. 2 shows another embodiment of the excimer laser, in which the etalon 3 is provided outside the cavity of the laser, i.e., outside the output mirror 2 and the other constituent parts are arranged in the similar manner to in FIG. 1.

Next consideration will be made as to the specifications of the etalon for obtaining a desired laser beam.

When light having a power spectrum $f(\lambda)$ is passed or transmitted through a single etalon, a transmitted light $T(\lambda)$ is generally written by an equation which follows.

$$T(\lambda) = f(\lambda)/[1 + (4/\pi^2)F_t\sin^2\{((\lambda-x)/FSR)\pi\}] \quad (1)$$

In the equation, $F_t$ is the total finesse of the etalon and given by the following equation (2).

$$F_t = \{(1/F_F)^2 + (1/F_R)^2 + (1/F_P)^2 + (1/F_d)^2\}^{-\frac{1}{2}} \quad (2)$$

where, $F_F$ is a finess based on the face accuracy in the air gap of the etalon, $F_R$ is a finesse base on reflection, $F_P$ is a finesse based on parellilism and $F_d$ is a finesse based on the divergence of the incident light beam. Further, quantity FSR denotes the free spectral range of the etalon and is given by an equation which follows.ps $$\begin{aligned}FSR &= x^2/2nd \\ &= x^2/2d (n = 1 \text{ for air gap})\end{aligned}$$

where, d is a mirror spacing, n is a refractive index of air space between the mirrors, and x is a center wave length (248.35 nm for the Kr/F excimer laser) of $f(\lambda)$.

When the etalon is disposed within the laser cavity, i.e., between the rear mirror and chamber, such a phenomenon takes place that the linewidth becomes very narrow when compared with that in the case of external provision of the etalon and both the threshold value of the laser oscillation and the apparent finesse of the etalon are increased. The reasons are as follows.

(1) Since light is turned many times within the cavity, it is transmitted through the etalon many times, in the case of the etalon is internally provided.

(2) In the case of the internal etalon, power is concentrated on wavelengths of light having high light intensity in the cavity.

The rates of increase in the threshold value and finesse vary with the type of the laser, the number of transversal modes, the throughput of the etalon and so on. Therefore, it is necessary to experimentally determine such factors in the case of the multi-mode, narrow band oscillation excimer laser.

Now assume that $\beta$ is an increase in the threshold value of the internal etalon (that is, when the etalon is provided between the rear mirror and chamber). Then an imaginally virtual power spectrum $f_{in}(\lambda)$ based on an increase of the threshold value is written as follows.

$$f(\lambda,\beta) \approx (f_{out}(\lambda) - \beta)/(1-\beta) \quad (3)$$

where, $f_{out}$ is a laser spectrum in the absence of the etalon.

Accordingly, a laser spectrum $T(\lambda)$ when the single internal etalon is provided between the rear mirror and chamber, is written by the following equation.

$$T(\lambda) \approx f(\lambda,\beta)/[1+(4/\pi^2)kF_t\sin^2\{(\lambda-x)/FSR)\pi\}] \quad (4)$$

where finesse coefficient k is determined to be the rate in which the linewidth becomes narrower.

A power spectrum $T(\lambda)$ of laser beam in the presence of n of the etalons, is given as follows.

$$T(\lambda) = f(\lambda,\beta) \cdot \prod_{k=1}^{n} E(K_k \cdot F_{tk}, FSR_k, \lambda) \quad (5)$$

where, $E(K_k, F_{tk}, FSR_k, \lambda) = 1/[1+(4/\pi^2)K_k \cdot F_{tk}\sin^2\{((\lambda-x)/FSR)\pi\}]$.

In general, $R_w(u,v)$, which is a white color optical transfer function for an illuminating optical system and reduced-projection lens, is found from the definition equation of the white color light optical transfer function (OTF) by integrating $R_\lambda(u,v)$ of the monochromatic light OTF with respect to wavelength range. That is, $$R_w(u,v) = \int_\lambda W_\lambda \cdot R_\lambda(u,v) d\lambda \quad (6)$$

where, $W_\lambda$ is a weight which the power spectrum of the excimer laser at a wavelength $\lambda$, i.e., a normalized light intensity at the wavelength $\lambda$ and is expressed by the following equation (7), and u and v are spatial frequencies, respectively.

$$W_\lambda = T(\lambda) / \int_\lambda T(\lambda) d\lambda \quad (7)$$

The $R_w(u,v)$ for the white color OTF must be larger than a minimum value $\alpha$ necessary for exposure of resist according to the reticle pattern, that is, $$R_w(u,v) \geq \alpha$$

As a result, when the conditions of the etalon are set so that the $R_w(u,v)$ of the white color OTF obtained by applying the the equation (6) a laser beam of oscillation in a narrow band and multi-mode obtained by the equation (5) has a value higher than $\alpha$, a desired resolution can be obtained.

Figure 3:
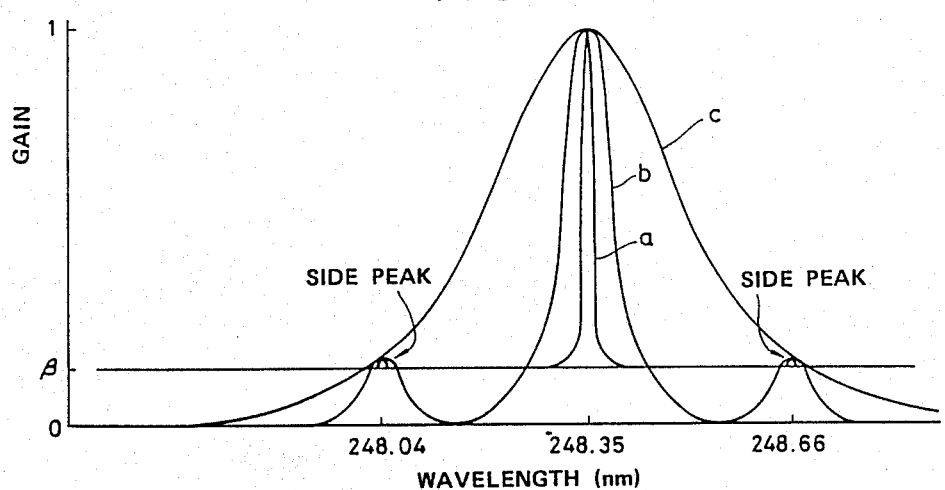
FIG. 3 is a graph showing gain curves when the etalon is provided inside and outside a cavity.

FIG. 3 shows test results of outputs of the excimer lasers of FIGS. 1 and 2 in an event where the air gap etalon 3 has, as its specifications, a free spectral range of 0.308 nm (for an air gap space of 100 $\mu$m), a finesse of 5, 90% reflectivity (when the reflecting film is made of $SiO_2$, $Al_2O_3$, $ZrO_2$, $HfO_2$, NaF and the like), a flatness of more than $\lambda/30$ ($\lambda=633$ nm), a parallelism of more than $\lambda/30$ ($\lambda=633$ nm) and an effective area of $10\times20$ nm$^2$.

More specifically, shown in FIG. 3 are a gain curve in the case of the so-called intra cavity etalon of FIG. 1 in which the etalon is disposed in the laser cavity, a gain curve b in the case of the so-called external etalon of FIG. 2 in which the etalon is provided outside the cavity and a gain curve c in the case of free running. Our tests showed that the full widths at half maximum of intra cavity and external etalon arrangements are 0.00925 nm and 0.0616 nm respectively. Further, the finesses of intra cavity and external etalons are 33.3 and 5 respectively, that is, the finesse of intra cavity etalon is 6.7 times the finesse of the external etalon. Our tests showed that the finesse coefficient was 5 to 7.

In the case of intra cavity etalon in FIG. 3, the side peak leading to reduction of the resolution is reduced to about 1/10 of that in the case of the external etalon. In this way, such a phenomenon that the light intensity rate of the side peak is decreased, was observed even when two or more of the etalons are provided. The reason is considered to be due to the fact that light transmission through the etalons causes the loss of the gain to be increased so that the threshold value of the laser oscillation increases.

Figure 4:
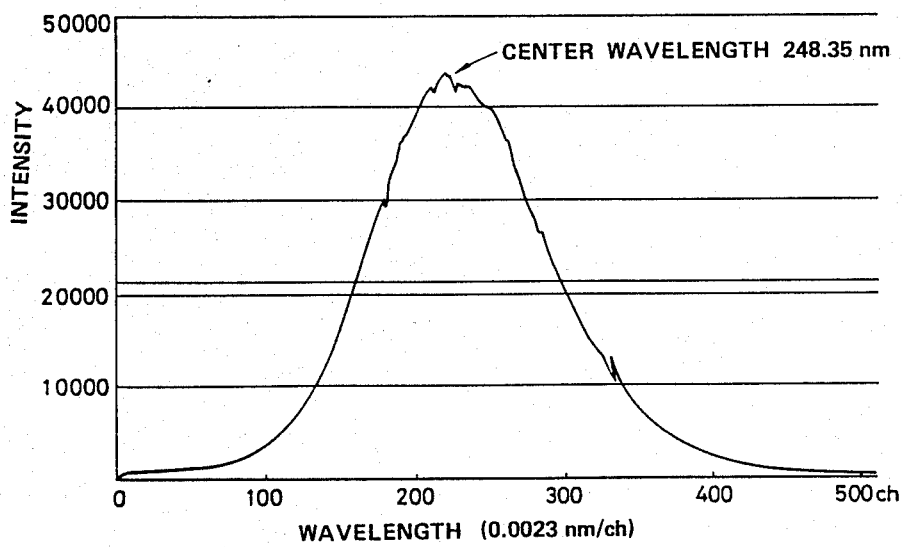
FIG. 4 is a graph showing a power spectrum based on free running of a KrF excimer laser.

The rate $\beta$ in the increase of the threshold value, when the rate in the decrease of the side peak was taken into consideration, was about between 0.10 and 0.06. The result of the power spectrum $f_{out}(\lambda)$ of free running of the KrF excimer laser measured with use of a monochrometer was as shown in FIG. 4.

The imaginary power spectrum $f_{in}(\lambda,\beta)$ of the KrF excimer laser in the case of use of the intra cavity etalon is expressed as follows, from the power spectrum $f_{out}(\lambda)$ in accordance with the equation (3).

$$f(\lambda,\beta) \approx (f_{out}(\lambda) - \beta)/(1-\beta)$$

where, $\beta = 0.06$ to $0.10$.

In an event where a single etalon is disposed between a rear mirror and a chamber as shown, for example, in FIG. 1, the spectrum waveform $T(\lambda)$ is given as follows.

$$T(\lambda) \approx f_{in}(\lambda,\beta) \cdot E(k \cdot F_t, FSR, \lambda) \quad (8)$$

where $\beta = 0.06$ to $0.10$ and $k = 5$ to $7$.

When a single external etalon is provided as shown in FIG. 2, on the other hand, the spectrum waveform $T(\lambda)$ is expressed by the equation (8) when $\beta=0$ and $k=1$.

Figure 5:
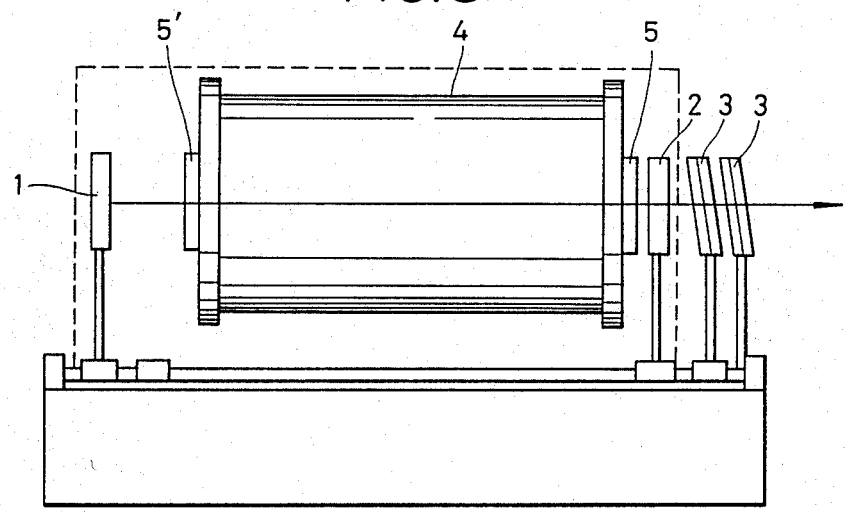

When two of the external etalons are provided as shown in FIG. 5, $T(\lambda)$ is given as follows.

$$T(\lambda) < f(\lambda,\beta) \cdot E(k_1 \cdot F_{t1}, FSR_1, \alpha) \cdot E(k_2 \cdot F_{t2}, FSR_2, \lambda) \quad (9)$$

where $\beta=0$, and $k_1$ and $k_2=1$.

Figure 6:
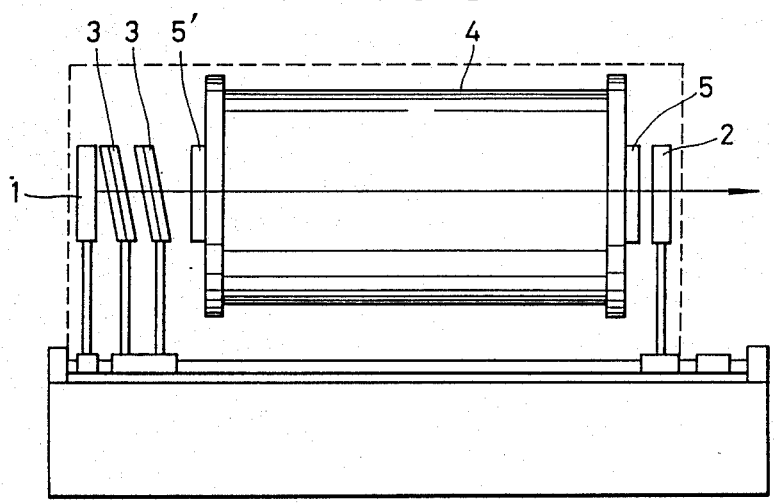

When two of the etalons are provided between a laser chamber and a rear mirror as shown in FIG. 6, $T(\lambda)$ is given by the equation (9) when $\beta=0.06$ to $0.10$, and $k_1$ and $k_2$ are 5 to 7.

Figure 7:
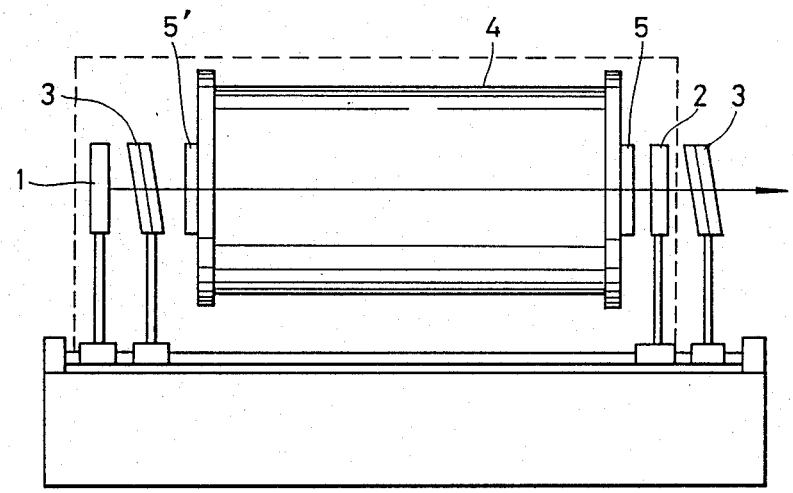

If a single intra cavity etalon is provided between a laser chamber and a rear mirror and the single external etalon is provided as shown in FIG. 7, then $T(\lambda)$ is given by the equation (9) when $\beta=0.06$ to $0.10$, $k_1 = 5$ to $7$ and $k_2=1$.

Figure 8:
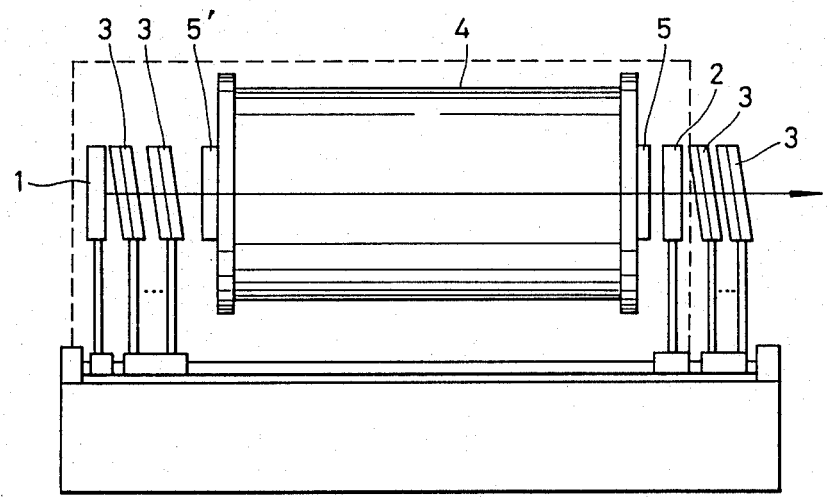

In an event where n of the etalons are provided as shown in FIG. 8, the power spectrum waveform $(T(\lambda))$ of the laser beam is expressed by the equation (5) when $\beta=0.06$ to $0.10$, $K_k$ is 5 to 7 in the presence of any of the etalons between the laser chamber and rear mirror, and 1 in the presence of any of the etalons outside the cavity.

The spectrum waveform calculated in accordance with the above equations well coincides with the experimentally obtained one.

Table 2(a) to (d) show exemplanary specifications of the etalon when the white color light OTF $R_w$ is above 0.4 with a resolving power of 0.5 $\mu$m and predetermined exposure areas, as results of calculation with use of the spectrum waveforms as test results of such reduced-projection lenses made of fused silica and designed for an excimer laser of monochromatic light having an exposure wavelength of 248.35 nm as shown in Table 1(a) to (d) and with use of the equations (6) and (7). In Tables 1 and 2, R(I) denotes a curvature radius of a lense surface, D(I) denotes a surface interval, and NA denotes a numerical aperture.

TABLE 1 (a)

| Reduction Ratio 5:1, NA = 0.3 Field Size: 10 × 10 mm$^2$ | | | |
|---|---|---|---|
| Surface No. | R(I) | D(I) | |
| (1) | 345.6500 | 7.7000 | SiO$_2$ |
| (2) | 121.0600 | 10.8500 | |
| (3) | −123.0700 | 7.7000 | SiO$_2$ |
| (4) | 242.0700 | 105.5800 | |
| (5) | −306.4100 | 14.0000 | SiO$_2$ |
| (6) | −170.9100 | 6.7800 | |
| (7) | 662.8500 | 19.4000 | SiO$_2$ |
| (8) | −214.8400 | 415.2100 | |
| (9) | 224.0800 | 8.8000 | SiO$_2$ |
| (10) | 405.3500 | 86.9800 | |
| (11) | 212.7300 | 10.2000 | SiO$_2$ |
| (12) | 433.6000 | 1.7500 | |
| (13) | 153.4500 | 9.5000 | SiO$_2$ |
| (14) | 89.6600 | 6.4200 | |
| (15) | 232.5900 | 8.0000 | SiO$_2$ |

TABLE 1 (a)-continued

Reduction Ratio 5:1, NA = 0.3
Field Size: 10 × 10 mm²

| Surface No. | R(I) | D(I) | |
|---|---|---|---|
| (16) | 409.1000 | 6.9800 | |
| (17) | −282.7200 | 8.5000 | SiO₂ |
| (18) | −274.7200 | 7.8700 | |
| (19) | −99.6300 | 28.2300 | SiO₂ |
| (20) | −124.7700 | 80.8300 | |
| (21) | 178.5800 | 13.2800 | SiO₂ |
| (22) | −325.6100 | 32.2900 | |
| (23) | 113.9100 | 9.2700 | SiO₂ |
| (24) | 711.0600 | 59.9600 | |
| (25) | 189.1900 | 29.0500 | SiO₂ |
| (26) | 539.8200 | 4.8500 | |
| (27) | −87.3700 | 4.8300 | SiO₂ |
| (28) | −713.5200 | .0000 | |

TABLE 1 (b)

Reduction Ratio 5:1, NA = 0.3
Field Size 10 × 10 mm²

| Surface No. | R(I) | D(I) | |
|---|---|---|---|
| (1) | 131.17650 | 12.400000 | SiO₂ |
| (2) | 93.27959 | 6.700000 | |
| (3) | −100.46322 | 22.000000 | SiO₂ |
| (4) | 143.08259 | 73.000000 | |
| (5) | INFINITY | 23.500000 | SiO₂ |
| (6) | −135.03068 | 0.100000 | |
| (7) | 242.20820 | 14.900000 | SiO₂ |
| (8) | −257.66086 | 0.100000 | |
| (9) | 184.26114 | 16.399994 | SiO₂ |
| (10) | INFINITY | 0.100000 | |
| (11) | 129.89512 | 14.599999 | SiO₂ |
| (12) | 268.36447 | 33.199997 | |
| (13) | −444.97981 | 5.000000 | SiO₂ |
| (14) | 73.95901 | 4.299999 | |
| (15) | 1158.76943 | 5.000000 | SiO₂ |
| (16) | 95.56114 | 6.000000 | |
| (17) | INFINITY | 17.500000 | SiO₂ |
| (18) | −232.82731 | 114.000000 | |
| (19) | 401.67018 | 30.000000 | SiO₂ |
| (20) | −304.89259 | 0.100000 | |
| (21) | 119.97078 | 22.599991 | SiO₂ |
| (22) | −727.56348 | 0.100000 | |
| (23) | 94.79885 | 14.000000 | SiO₂ |
| (24) | 301.67505 | 3.000000 | |
| (25) | −1329.98382 | 19.099991 | SiO₂ |
| (26) | 2975.78633 | 15.000000 | |
| (27) | INFINITY | 18.000000 | SiO₂ |
| (28) | 193.30636 | 24.455593 | |

TABLE 1 (c)

Reduction Ratio 5:1, NA = 0.036
Field Size: 15 × 15 mm²

| Surface No. | R(I) | D(I) | |
|---|---|---|---|
| (1) | 178.6439 | 17.0000 | SiO₂ |
| (2) | −400.8164 | .2000 | |
| (3) | 160.0833 | 24.0000 | SiO₂ |
| (4) | 76.7476 | 18.5000 | |
| (5) | −105.0716 | 21.0000 | SiO₂ |
| (6) | 194.6593 | 76.5000 | |
| (7) | INFINITY | 23.5000 | SiO₂ |
| (8) | −171.4472 | .2000 | |
| (9) | 399.5347 | 32.0000 | SiO₂ |
| (10) | −301.4124 | .2000 | |
| (11) | 195.3320 | 21.0000 | SiO₂ |
| (12) | −1183.7886 | .2000 | |
| (13) | 146.8835 | 16.0000 | SiO₂ |
| (14) | 830.5295 | 14.0000 | |
| (15) | INFINITY | 5.0000 | SiO₂ |
| (16) | 74.3100 | 14.5000 | |
| (17) | −185.0336 | 5.0000 | SiO₂ |
| (18) | 143.2734 | 130.1956 | |
| (19) | 3019.3042 | 14.0000 | SiO₂ |
| (20) | −376.4888 | .2000 | |
| (21) | 947.0281 | 31.0000 | SiO₂ |
| (22) | −310.6545 | 143.0000 | |

TABLE 1 (c)-continued

Reduction Ratio 5:1, NA = 0.036
Field Size: 15 × 15 mm²

| Surface No. | R(I) | D(I) | |
|---|---|---|---|
| (23) | 658.8269 | 23.5000 | SiO₂ |
| (24) | −405.3201 | .2000 | |
| (25) | 124.4284 | 28.5000 | SiO₂ |
| (26) | −1515.6514 | .2000 | |
| (27) | 131.8725 | 20.5090 | SiO₂ |
| (28) | 296.6548 | 4.5000 | |
| (29) | −1309.5586 | 24.6766 | SiO₂ |
| (30) | 463.9672 | 20.5002 | |
| (31) | 2292.9016 | 24.0000 | SiO₂ |
| (32) | 181.0752 | .0000 | |

TABLE 1 (d)

Reduction Ratio 5:1, NA = 0.30 to 0.40
Field Size: 15 × 15 mm²

| Surface No. | R(I) | D(I) | |
|---|---|---|---|
| (1) | 132.00107 | 24.000000 | SiO₂ |
| (2) | −729.93252 | 0.300000 | |
| (3) | 246.82499 | 34.000000 | SiO₂ |
| (4) | 93.35740 | 26.000000 | |
| (5) | −126.16589 | 29.000000 | SiO₂ |
| (6) | 145.79960 | 100.000000 | |
| (7) | −578.92922 | 34.500000 | SiO₂ |
| (8) | −206.75273 | 0.300000 | |
| (9) | 414.25510 | 37.000000 | SiO₂ |
| (10) | −376.35358 | 0.300000 | |
| (11) | 139.16929 | 33.000000 | SiO₂ |
| (12) | −2390.72255 | 0.300000 | |
| (13) | 169.08068 | 18.000000 | SiO₂ |
| (14) | 735.10957 | 13.000000 | |
| (15) | 2645.80525 | 7.000000 | SiO₂ |
| (16) | 86.60173 | 25.000000 | |
| (17) | −168.77662 | 7.000000 | SiO₂ |
| (18) | 113.92879 | 118.800000 | |
| (19) | INFINITY | 16.000000 | SiO₂ |
| (20) | −360.89699 | 56.000000 | |
| (21) | 1091.24935 | 44.500000 | SiO₂ |
| (22) | −347.23958 | 83.800000 | |
| (23) | 3826.08163 | 31.000000 | SiO₂ |
| (24) | −3826.14019 | 0.300000 | |
| (25) | 836.30728 | 32.500000 | SiO₂ |
| (26) | −472.11516 | 0.300000 | |
| (27) | 150.88504 | 31.000000 | SiO₂ |
| (28) | INFINITY | 0.300000 | |
| (29) | 138.31440 | 18.000000 | SiO₂ |
| (30) | 202.49177 | 18.000000 | |
| (31) | −1077.37560 | 37.000000 | SiO₂ |
| (32) | 1682.80642 | 21.300000 | |
| (33) | 478.49797 | 27.500000 | SiO₂ |
| (34) | 548.93398 | 26.168679 | |

TABLE 2 (a)

A single etalon is provided between rear mirror and chamber

| No. | Total Finesse Range | Free Spectial Range [n m] | Full Width at Half Maximum [n m] | Power Range [mJ/pulse] |
|---|---|---|---|---|
| 1 | 12~13 | 0.56~0.62 | 0.0062~0.0074 | 57~80 |
| 2 | 11~12 | " | 0.0067~0.081 | 72~87 |
| 3 | 9.4~11 | " | 0.0073~0.0094 | 78~98 |
| 4 | 12~13 | 0.49~0.56 | 0.0054~0.0067 | 58~72 |
| 5 | 11~12 | " | 0.0058~0.0073 | 62~78 |
| 6 | 10~11 | " | 0.0064~0.008 | 69~86 |
| 7 | 8.5~10 | " | 0.0070~0.0094 | 75~101 |
| 8 | 12~13 | 0.43~0.49 | 0.0047~0.0058 | 50~62 |
| 9 | 11~12 | " | 0.0056~0.0064 | 60~69 |
| 10 | 10~11 | " | 0.0058~0.0070 | 62~75 |
| 11 | 9~10 | " | 0.0061~0.0078 | 66~84 |
| 12 | 7.5~9 | " | 0.0068~0.0093 | 73~98 |
| 13 | 12~13 | 0.37~0.43 | 0.0041~0.0051 | 44~55 |
| 14 | 11~12 | " | 0.0044~0.0056 | 47~60 |
| 15 | 10~11 | " | 0.0048~0.0061 | 52~66 |
| 16 | 9~10 | " | 0.0053~0.0068 | 57~73 |
| 17 | 8~9 | " | 0.0059~0.0077 | 63~83 |
| 18 | 6.6~8 | " | 0.0066~0.0093 | 71~96 |

TABLE 2 (a)-continued

A single etalon is provided between rear mirror and chamber

| No. | Total Finesse Range | Free Spectral Range [n m] | Full Width at [n m] Half Maximum | Power Range [mJ/pulse] |
|---|---|---|---|---|
| 19 | 12~13 | 0.31~0.37 | 0.0034~0.0044 | 37~47 |
| 20 | 11~12 | " | 0.0037~0.0048 | 39~52 |
| 21 | 10~11 | " | 0.0040~0.0053 | 43~56 |
| 22 | 9~10 | " | 0.0044~0.0059 | 47~63 |
| 23 | 8~9 | " | 0.0049~0.0066 | 53~71 |
| 24 | 7~8 | " | 0.0055~0.0075 | 59~81 |
| 25 | 5.6~7 | " | 0.0073~0.0094 | 79~98 |
| 26 | 12~13 | 0.25~0.31 | 0.0027~0.0037 | 29~40 |
| 27 | 11~12 | " | 0.0030~0.0040 | 32~43 |
| 28 | 10~11 | " | 0.0032~0.0044 | 34~47 |
| 29 | 9~10 | " | 0.0036~0.0049 | 39~53 |
| 30 | 8~9 | " | 0.0040~0.0055 | 43~59 |
| 31 | 7~8 | " | 0.0045~0.0063 | 48~68 |
| 32 | 6~7 | " | 0.0051~0.0074 | 55~79 |
| 33 | 5~6 | " | 0.0060~0.0086 | 64~42 |
| 34 | 4.6~5 | " | 0.0071~0.0096 | 76~103 |

TABLE 2 (b)

Two etalons are provided between rear mirror and chamber

| No. | Total Finesse Range | Free Spectral Range [n m] | Full Width at [n m] Half Maximum | Power Range [mJ/pulse] |
|---|---|---|---|---|
| 1 | $Ft_1 = 5$<br>$Ft_2 = 1.5$ | $FSR_1 = 0.31$<br>$FSR_2 = 0.0177$ | 0.0040 | 43 |
| 2 | $Ft_1 = 4$<br>$Ft_2 = 3$ | $FSR_1 = 0.13$<br>$FSR_2 = 0.19$ | 0.0050 | 32 |
| 3 | $Ft_1 = 3$<br>$Ft_2 = 4$ | $FSR_1 = 0.14$<br>$FSR_2 = 0.22$ | 0.0050 | 30 |
| 4 | $Ft_1 = 2.2$<br>$Ft_2 = 4$ | $FSR_1 = 0.037$<br>$FSR_2 = 0.25$ | 0.0038 | 35 |
| 5 | $Ft_1 = 2$<br>$Ft_2 = 3$ | $FSR_1 = 0.026$<br>$FSR_2 = 0.28$ | 0.0036 | 40 |
| 6 | $Ft_1 = 4$<br>$Ft_2 = 4$ | $FSR_1 = 0.14$<br>$FSR_2 = 0.31$ | 0.0048 | 20 |
| 7 | $Ft_1 = 2.5$<br>$Ft_2 = 4$ | $FSR_1 = 0.063$<br>$FSR_2 = 0.26$ | 0.0038 | 30 |
| 8 | $Ft_1 = 1.5$<br>$Ft_2 = 5$ | $FSR_1 = 0.03$<br>$FSR_2 = 0.37$ | 0.0048 | 25 |
| 9 | $Ft_1 = 3$<br>$Ft_2 = 4$ | $FSR_1 = 0.062$<br>$FSR_2 = 0.31$ | 0.0051 | 31 |
| 10 | $Ft_1 = 2$<br>$Ft_2 = 4$ | $FSR_1 = 0.04$<br>$FSR_2 = 0.31$ | 0.0048 | 35 |

TABLE 2 (c)

Two Etalons are provided in front of a beam out put mirror or between the beam output mirror and chamber

| No. | Total Finesse | Free Spectral Range [n m] | Full Width at [n m] Half Maximum | Power Range [mJ/pulse] |
|---|---|---|---|---|
| 1 | $Ft_1 = 13$<br>$Ft_2 = 13$ | $FSR_1 = 0.081$<br>$FSR_2 = 0.28$ | 0.0060 | 2.0 |
| 2 | $Ft_1 = 13$<br>$Ft_2 = 13$ | $FSR_1 = 0.062$<br>$FSR_2 = 0.34$ | 0.0046 | 1.5 |
| 3 | $Ft_1 = 10$<br>$Ft_2 = 13$ | $FSR_1 = 0.049$<br>$FSR_2 = 0.27$ | 0.0052 | 1.7 |
| 4 | $Ft_1 = 9$<br>$Ft_2 = 13$ | $FSR_1 = 0.043$<br>$FSR_2 = 0.24$ | 0.0053 | 1.7 |
| 5 | $Ft_1 = 12$<br>$Ft_2 = 12$ | $FSR_1 = 0.068$<br>$FSR_2 = 0.25$ | 0.0062 | 2.0 |
| 6 | $Ft_1 = 11$<br>$Ft_2 = 12$ | $FSR_1 = 0.056$<br>$FSR_2 = 0.25$ | 0.0054 | 1.8 |
| 7 | $Ft_1 = 10$<br>$Ft_2 = 12$ | $FSR_1 = 0.050$<br>$FSR_2 = 0.22$ | 0.0046 | 1.6 |
| 8 | $Ft_1 = 11$<br>$Ft_2 = 11$ | $FSR_1 = 0.056$<br>$FSR_2 = 0.20$ | 0.0048 | 1.6 |
| 9 | $Ft_1 = 10$<br>$Ft_2 = 11$ | $FSR_1 = 0.050$<br>$FSR_2 = 0.17$ | 0.0046 | 1.7 |
| 10 | $Ft_1 = 8$<br>$Ft_2 = 13$ | $FSR_1 = 0.037$<br>$FSR_2 = 0.167$ | 0.0042 | 1 |

Note:
The ourput and waveform are substantially same in either case where the etalons are provided in front of the beam output mirror or between the beam output mirror and chamber.

TABLE 2 (d)

A single etalon is provided between the rear mirror and chamber ((in)) and a single etalon is provided in front of a beam output mirror or between the output mirror and chamber((EX)).

| No | Total Finesse | Free Spectral Range [n m] | Full Width at [n m] Half Maximum | Power Range [mJ/pulse] |
|---|---|---|---|---|
| 1 | $(In)Ft_1 = 5$<br>$(Ex)Ft_2 = 8$ | $FSR_1 = 0.37$<br>$FSR_2 = 0.037$ | 0.0037 | 7.2 |
| 2 | $(In)Ft_1 = 4$<br>$(Ex)Ft_2 = 8$ | $FSR_1 = 0.32$<br>$FSR_2 = 0.037$ | 0.0036 | 8.3 |
| 3 | $(In)Ft_1 = 3$<br>$(Ex)Ft_2 = 11$ | $FSR_1 = 0.28$<br>$FSR_2 = 0.062$ | 0.0050 | 3.3 |
| 4 | $(In)Ft_1 = 2$<br>$(Ex)Ft_2 = 13$ | $FSR_1 = 0.028$<br>$FSR_2 = 0.062$ | 0.0038 | 1.9 |
| 5 | $(In)Ft_1 = 6$<br>$(Ex)Ft_2 = 13$ | $FSR_1 = 0.19$<br>$FSR_2 = 0.12$ | 0.0050 | 3.3 |
| 6 | $(In)Ft_1 = 7$<br>$(Ex)Ft_2 = 13$ | $FSR_1 = 0.25$<br>$FSR_2 = 0.16$ | 0.0037 | 2.5 |
| 7 | $(In)Ft_1 = 6$<br>$(Ex)Ft_2 = 13$ | $FSR_1 = 0.22$<br>$FSR_2 = 0.14$ | 0.0036 | 3.0 |
| 8 | $(In)Ft_1 = 5$<br>$(Ex)Ft_2 = 13$ | $FSR_1 = 0.43$<br>$FSR_2 = 0.062$ | 0.0050 | 3.2 |
| 9 | $(In)Ft_1 = 6$<br>$(Ex)Ft_2 = 12$ | $FSR_1 = 0.62$<br>$FSR_2 = 0.050$ | 0.0042 | 5.0 |
| 10 | $(In)Ft_1 = 13$<br>$(Ex)Ft_2 = 11$ | $FSR_1 = 0.62$<br>$FSR_2 = 0.050$ | 0.0045 | 4.0 |

In addition, the ranges of the specifications of the etalons used in the above tests are as follows.

Reflectivity = 50 to 90%
Reflective Finesse $F_R$ = 4.4 to 43.3
Flatness = $\lambda/20$ to $\lambda/100$ (633 nm)
Flatness Finesse $F_F$ = 3.9 to 19.5
Parallelism = $\lambda/20$ to $\lambda/100$ (633 nm)
Parallelism Finesse $F_P$ = 3/9 to 19.5
Angle Between Laser Optical Axis and Etalon = 0 to 2.5° when the etalon is provided between the chamber and beam output mirror, 0° to 2.5° when the etalon is provided in front of the output mirror, and 0.1° to 5° when the etalon is provided between the rear mirror and chamber.
Finesse Based On Beam Divergence $F_d$ = 2 to 500
Effective Diameter = 20 mm $\phi$ or more
Total Finesse $F_t$ = 1.5 to 13.1

Air Gap=50 to 5000 μm

Free Spectral Range FSR=0.0062 to 0.62

When an excimer laser comprising the etalon(s) having such specifications as shown in Table 2(a) to (d) is used as a laser beam source, exposure with a resolving power of about 0.5 μm can be achieved.

Further, it has been found that provision of the etalon between the laser chamber and rear mirror enables remarkable increase of the laser output.

As a result of conducting an interference test on the oscillation of the laser of the present invention. substantially no interference has been observed. However, when the interference test is carried out by adjusting the diameter of a pin hole provided in the cavity, a speckle pattern takes place for a pin hole diameter of about 2 mm. For this reason, the effective diameter of the slit in the cavity and etalon must be set to be about 2 mm or more.

Next, explanation will be made as to how to set the inclination angle of the etalon when the etalon is provided between the rear mirror and chamber.

Figure 9:
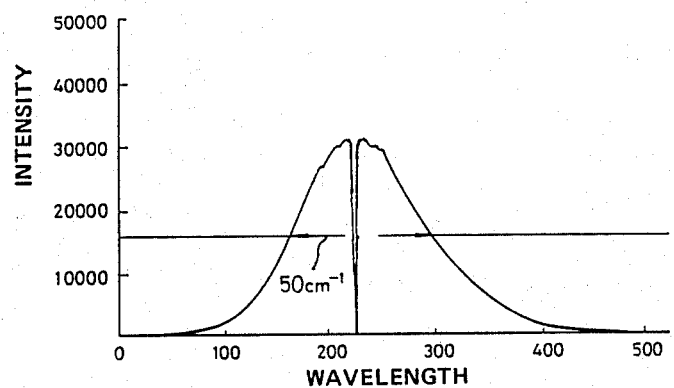
FIG. 9 shows a spectral characteristic when the etalon is aligned with a beam output mirror.

FIG. 9 shows a test result of output of the excimer laser shown in FIG. 1 and comprising the air gap etalon 3 having, as its specifications, a free spectral range of 50 $cm^{-1}$ (the air gap space is set to be 100 μm), a reflection factor of 90%, a surface accuracy of $\lambda/10$ or more (248.4 nm), a parallelism of $\lambda/10$ or more and an effective diameter of 35 mϕ.

Figure 10:
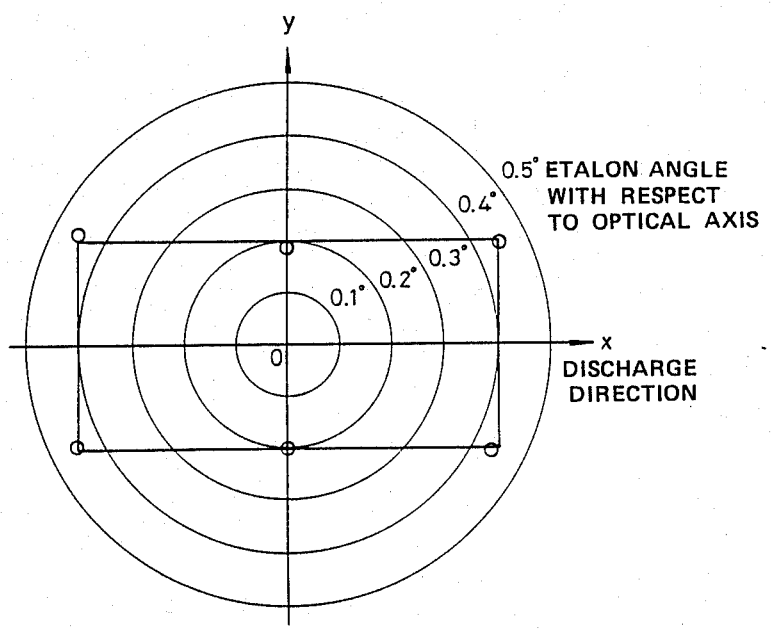
FIG. 10 shows a range of angle at which the etalon becomes a total reflective mirror.

As shown in FIG. 9, when the beam output mirror 2 gets in alignment with the etalon 3, the etalon 3 functions as a total reflective mirror 1 to totally reflect the beam, whereby the output of the excimer laser provides a free running linewidth of 50 ($cm^{-1}$). The inclination angle range in which the etalon 3 acts as the total reflective mirror 1, is shown in FIG. 10. That is, the inclination angle of the etalon 3 must be set to be out of such a rectangular area as shown in FIG. 10 to shift the alignment with the beam output mirror 2.

Figure 11:
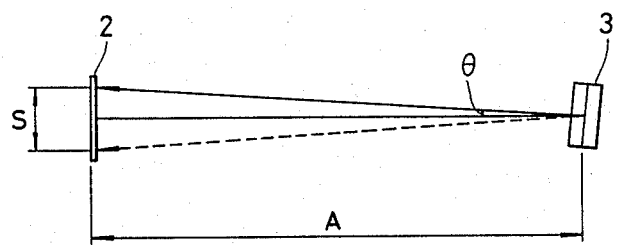
FIG. 11 is a diagram for explaining how to find the conditions of etalon inclination angle.

FIG. 11 shows how to find the inclination angle of the etalon 3 at which the etalon 3 does not act as a total reflective mirror. It is considered that when the inclination angle of the etalon 3 in the oscillation zone at the beam output mirror 2 coincides with that of the output mirror 2, at least the etalon 3 functions as a total reflective mirror and this affects the wavelength selection. Assuming that the dimension of a beam of the beam output mirror is S (cm) and a distance between the etalon 3 and the beam output mirror 2 is A (cm), the inclination angle $\theta$ of the normal of the etalon with respect to the optical axis is given as follows.

$$\theta = \tan^{-1} S/2A \qquad (10)$$

The inclination angle $\theta$ calculated by substituting A=140 (cm) and S=1$\sqrt{5}$(cm) for A and S in the equation (10) well coincided with that obtained from our tests.

Figure 12:
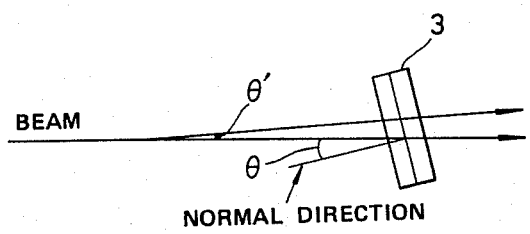
FIG. 12 shows a relationship between a beam divergence angle and the etalon inclination angle.

Next, explanation will be directed to the inclination angle $\theta$ with respect to the beam divergence angle and the dependency of a linewidth K. The fundamental equation for the wavelength of light transmitted through the etalon is given by $$m\lambda = 2d \cos\theta \qquad (11)$$

where m is an integer and d is an air gap distance. Supposing that $\theta'$ is the beam divergence angle, a relationship between the etalon inclination angle $\theta$ and the beam divergence angle $\theta'$ is as shown in FIG. 12. Assume now that $\lambda_o$ is a selected wavelength when the beam is directed on the etalon 3 at a right angle. Then the equation (11) is rewritten as follows.

$$m\lambda_o = 2d \qquad (12)$$

And the following equations (13) and (14) are satisfied for wavelengths $\lambda_1$ and $\lambda_2$ of the etalon transmission beam at incident angles $\theta$ and $(\theta+\theta')$ respectively.

$$m\lambda_1 = 2d \cos\theta \qquad (13)$$

$$m\lambda_2 = 2d \cos(\theta+\theta') \qquad (14)$$

Accordingly, a difference between the wavelengths $\lambda_1$ and $\lambda_2$ of the transmission beam is expressed as follows from the equations (12), (13) and (14).

$$\lambda_1 - \lambda_2 = \lambda_o\{\cos\theta - \cos(\theta+\theta')\} \qquad (15)$$

As a result, the linewidth K is $$K = 1/\lambda_2 - 1/\lambda_1 = 1/\lambda_o\{1/\cos(\theta+\theta') - 1/\cos\theta\} \qquad (16)$$

Figure 13:
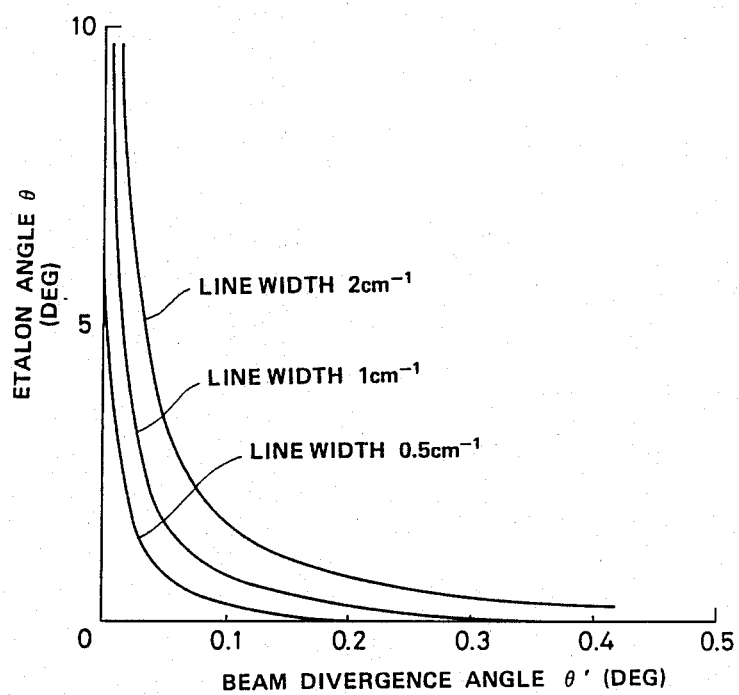
FIG. 13 shows a relationship between the beam divergence angle and etalon inclination angle.

When a relationship between the beam divergence andle $\theta'$ and the etalon inclination angle $\theta$ is found from the equation (16) so as to provide linewidths of, for example, 0.5 ($cm^{-1}$), 1 ($cm^{-1}$) and 2 ($cm^{-1}$), such inversely varying curves as shown in FIG. 13 are obtained.

Figure 14:
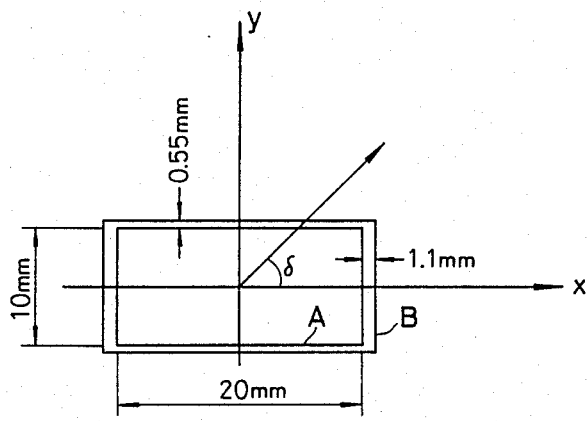
FIG. 14 shows a beam mode at a position 2m away from an outlet of the beam output mirror.

The beam divergence of the excimer laser having an arrangement of FIG. 1, when measured at a position 2 meters away from the outlet of the beam output mirror 2, had a size of 2.2 (mm) in the x-axis direction (in the abscissa axis direction with respect to the optical axis) and 1.1 (mm) in the y-axis direction (in the ordinate axis direction with respect to the optical axis), as shown in FIG. 14. In FIG. 14, reference symbol A denotes a beam mode at the outlet of the beam output mirror and B denotes a beam mode at the position 2 meters away from the outlet of the output mirror. Therefore, the beam divergences in the x-axis direction (in the discharging direction of the electrodes in the excimer laser) and in the y-axis direction are 1.1 (mrad)=0.06 (deg) and 0.55 (mrad)=0.03 (deg) respectively.

Thus, the beam divergence with respect to the etalon inclination direction varies depending on the direction in which the etalon is inclined relative to the section (x-y plane) of the laser beam. That is, this relation is expressed by the following equations.

$$\theta' = 0.06/\cos\delta \quad (0° \leq \alpha \leq \tan^{-1} 0.5) \qquad (17)$$

$$\theta' = 0.03/\sin\delta \quad (\tan^{-1} 0.5 \leq \alpha \leq 90°) \qquad (18)$$

where, $\delta$ is an angle of the beam with respect to the x axis when the beam is projected on the x-y plane in the etalon inclination direction.

Figure 15:
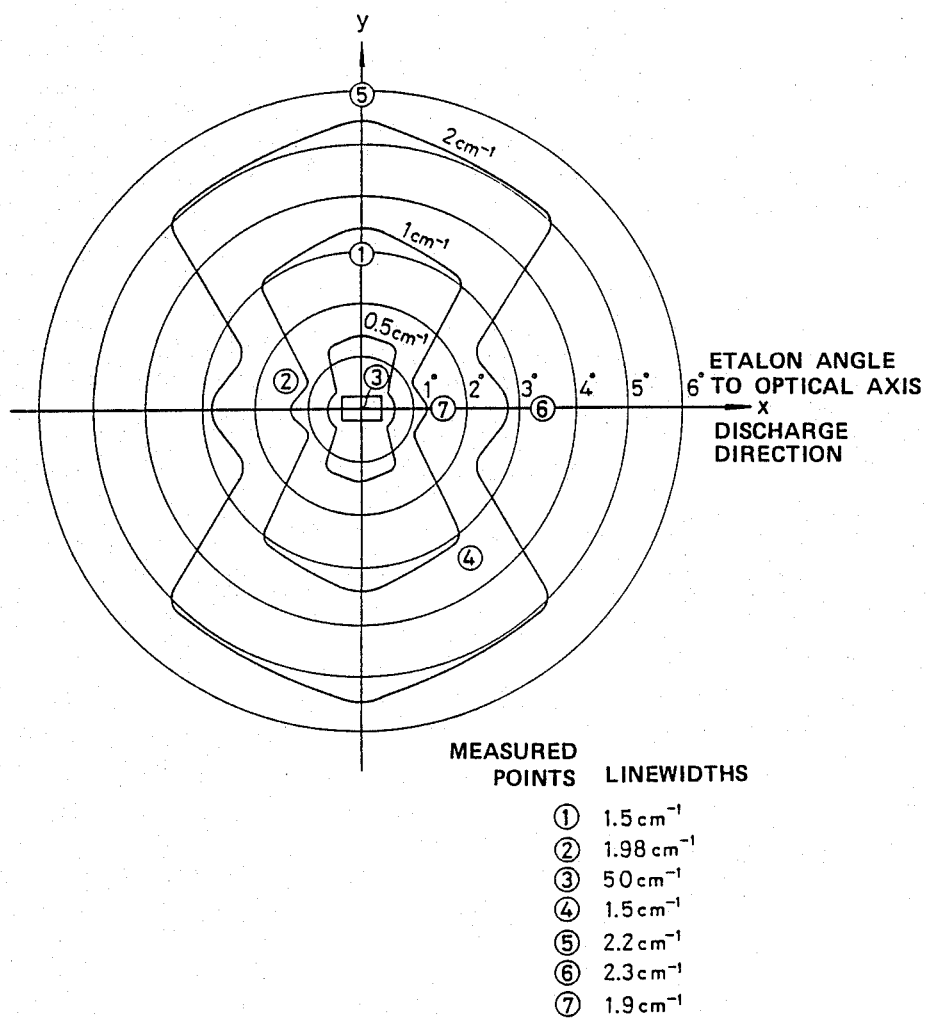
FIG. 15 shows a range of the etalon angle in which an oscillation linewidth has a desirable vale.
Figure 16:
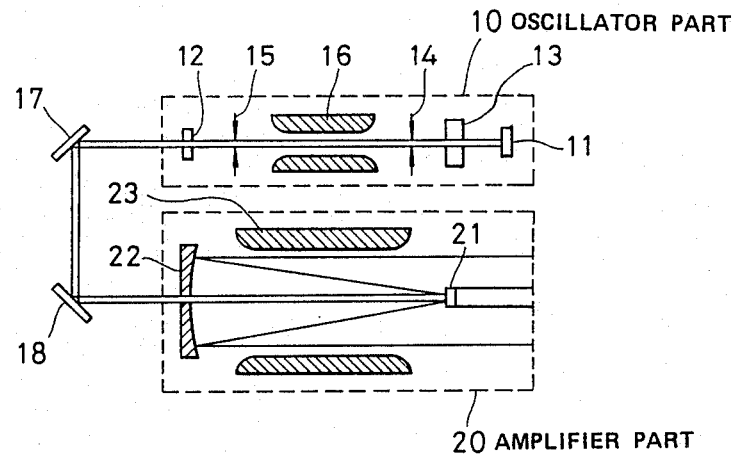
FIGS. 16 and 17 schematically show exemplary arrangements of prior art excimer lasers respectively.
Figure 17:
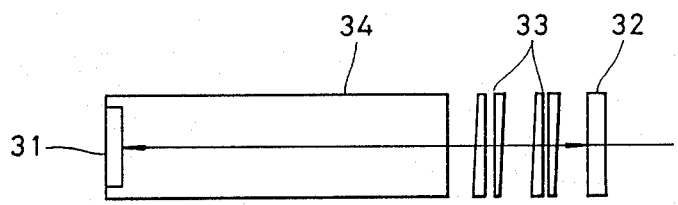

FIG. 15 shows characteristic curves of etalon angle range found from the quations (16), (17) and (18) when the linewidths are 0.5 ($cm^{-1}$), 1 ($cm^{-1}$) and 2 ($cm^{-1}$) respectively. It will be seen from FIG. 15 that actually measured values well fall in their theoretical ranges. In addition, it has been found that as a result of laser beam interference tests, substantially no interference is observed and multi-mode is achieved. Furthermore, outputs at these measured points were between 40 and 100 mJ per pulse and the oscillation was stable with high output.

Although the beam divergence angle $\theta'$ has been explained in the first quadrant of the coordinate system in the foregoing embodiment of the present invention, the similar explanation can be applied in the second, third and fourth quadrants.

Industrial Applicability

As has been explained in the foregoing, the excimer laser of the present invention is effectively used as a light source of a reduced-projection exposure system in photolithography or the like, and in particular, for light exposure of an integrator system.

We claim:

1. A multi-mode, narrow-band oscillation excimer laser for irradiating a laser beam onto a reticle pattern so as to project said reticle pattern onto a resist as a reticle pattern image, said excimer laser comprising an etalon for multi-mode and narrow band oscillation, characterized in that specifications of said etalon are set to satisfy a relation $\int_\lambda W_\lambda R_\lambda(u,v)d\lambda \geq \alpha$, where $\alpha$ represents an optical transfer function necessary for sensitizing a resist according to a reticle pattern, $R_\lambda(u,v)$ represents a monochromatic light optical transfer function of an illuminating system and a contracting-projection lens, $W_\lambda$ represents a weight which is applied to a spectral waveform at a given wavelength in a power spectrum of said oscillation laser beam, and is expressed by $W_\lambda = T(\lambda)/\int_\lambda T(\lambda)d\lambda$, where $T(\lambda)$ is a power spectrum of the oscillation laser beam and is expressed by $$T(\lambda) = f(\lambda,\beta) \cdot \prod_{k=1}^{n} E(K_k \cdot F_{tk}, FSR_k, \lambda),$$

where $f(\lambda,\beta)$ is a power spectrum of virtual free running based on an increase in a threshold value in the presence of the etalon between a chamber and a rear mirror, $\beta$ is a rate of increase in the threshold value, $E(K_k \cdot F_{tk}, FSR_k, \lambda)$ is a transfer function of power spectrum of light based on the single k-th etalon, $F_{tk}$ is a total finesse of each etalon, and $FSR_k$ is a free spectral range of each etalon, $K_k$ is a finesse coefficient, whereby said excimer laser produces a laser beam having a narrow frequency band, a high output and a spatially incoherent beam characteristic so as to make the contrast of said reticle pattern image on the resist sufficiently higher to give a preferable resolution to said reticle pattern image.

2. A multi-mode narrow-band oscillation excimer laser for irradiating a laser beam onto a reticle pattern so as to project said reticle pattern onto a resist as a reticle pattern image, said excimer laser comprising an etalon for oscillation of multimode and narrow band, characterized in that specifications of said etalon are set to satisfy a relation $\int_\lambda W_\lambda R_\lambda(u,v)d\lambda \geq \alpha$ where $\alpha$ is an optical transfer function necessary for light exposure of resist according to a reticle pattern, $R_\lambda(u,v)$ is an optical transfer function of monochromatic light for an illuminating system and a reduced-projection lens, $W_\lambda$ is a weight which is applied to a waveform of a power spectrum in an oscillation laser beam at a wavelength $\lambda$ and is expressed by $W_\lambda = T(\lambda)/\int_\lambda T(\lambda)d\lambda$, where $T(\lambda)$ is a power spectrum of the oscillation laser beam and is expressed by $$T(\lambda) = f(\lambda,\beta) \cdot \prod_{k=1}^{n} E(K_k \cdot F_{tk}, FSR_k, \lambda),$$

where $f(\lambda,\beta)$ is a power spectrum of virtual free running based on an increase in a threshold value in the presence of the etalon between a chamber and a rear mirror, $\beta$ is a rate of increase in the threshold value, $E(K_k \cdot F_{tk}, FSR_k, \lambda)$ is a transfer function of a power spectrum of light based on the single k-th etalon, $F_{tk}$ is a total finesse of each etalon, and $FSR_k$ is a free spectral range of each etalon, $K_k$ is a finesse coefficient;

and further characterized in that an inclination angle $\theta$ of the etalon is selected to be $\theta > \tan^{-1} S/2A$, where S is a dimension of a beam at a beam output mirror and A is a distance between the etalon and beam output mirror, and an oscillation linewidth K is set to satisfy relations $K = 1/\lambda_o[1/\{\cos(\theta+\theta')\} - 1/\cos\theta]$ with $K \leq x$, where $\lambda_o$ is a selected wavelength when the beam is directed onto the etalon at a normal angle, $\theta'$ is a beam divergence angle, and x is an allowable linewidth of a light exposure system using the excimer laser as a light source, whereby said excimer laser produces a laser beam of a desired linewidth having a narrow frequency band, a high output and a spatially incoherent beam characteristic so as to make the contrast of said reticle pattern image on the resist sufficiently higher to give a preferable resolution to said reticle pattern image.

* * * * *